(12) United States Patent
Kang et al.

(10) Patent No.: US 6,194,281 B1
(45) Date of Patent: Feb. 27, 2001

(54) METHODS OF FORMING THREE-DIMENSIONAL CAPACITOR STRUCTURES INCLUDING OZONE TETRAETHYLORTHOSILICATE UNDOPED SILICATE

(75) Inventors: Seong-hun Kang; Young-lark Koh; Jung-kyu Lee, all of Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 08/961,448

(22) Filed: Oct. 30, 1997

(30) Foreign Application Priority Data

Feb. 17, 1997 (KR) .................................................. 97-4671

(51) Int. Cl.$^7$ ............................................... H01L 21/8242
(52) U.S. Cl. ......................... 438/398; 438/253; 438/255; 438/396
(58) Field of Search ................................... 438/396, 253, 438/398, 255, 397, 254

(56) References Cited

U.S. PATENT DOCUMENTS

| | | | | |
|---|---|---|---|---|
| 5,633,188 | * | 5/1997 | Ogawa | 438/396 |
| 5,661,065 | * | 8/1997 | Koga | 438/253 |
| 5,688,726 | * | 11/1997 | Kim | 438/397 |
| 5,736,450 | * | 4/1998 | Huang et al. | 438/396 |
| 5,744,389 | * | 4/1998 | Kim | 438/253 |

OTHER PUBLICATIONS

Watanabe et al., *Hemispherical Grained Si Formation on in–situ Phosphorus Doped Amorphous–Si Electrode for 256Mb DRAM's Capacitor*, IEEE Transaction On Electron Devices, vol. 42, No. 7, Jul. 1995, pp. 1247–1254.

* cited by examiner

*Primary Examiner*—Carl Whitehead, Jr.
*Assistant Examiner*—Toniae M. Thomas
(74) *Attorney, Agent, or Firm*—Myers Bigel Sibley & Sajovec

(57) ABSTRACT

A method of forming an integrated circuit capacitor includes the steps of forming an insulating layer on an integrated circuit substrate, and forming a conductive layer on the insulating layer opposite the integrated circuit substrate. A patterned ozone tetraethylorthosilicate undoped silicate layer is formed on the conductive layer, and conductive spacers are formed along sidewalls of the ozone tetraethylorthosilicate undoped silicate layer. A dielectric layer is formed on the conductive spacers and on the first conductive layer, and a second conductive layer is formed on the dielectric layer opposite the first conductive layer in the conductive spacers.

25 Claims, 4 Drawing Sheets

METHODS OF FORMING THREE-DIMENSIONAL CAPACITOR STRUCTURES INCLUDING OZONE TETRAETHYLORTHOSILICATE UNDOPED SILICATE

FIELD OF THE INVENTION

The present invention relates to the field of integrated circuits and more particularly to methods of forming capacitor structures for integrated circuit devices.

BACKGROUND OF THE INVENTION

As dynamic random access memory (DRAM) devices become more highly integrated, the sizes of individual memory cells are reduced. The decrease in size of a memory cell is thus proportional to the increase in the capacity of a DRAM device. As the surface area of the integrated circuit substrate available for each memory cell is reduced, the height of the stacked chip structure may increase.

In order to provide normal memory device operation, the capacitance of the memory cell capacitors and the voltage applied to the elements of the memory device are preferably maintained at predetermined levels as the integration densities increase. Stated in other words, effective voltage ranges and capacitances for the elements of highly integrated DRAM devices should be maintained at predetermined levels as the size of the device elements are reduced. Accordingly, more complex device structures may be needed to provide a desired level of performance in a highly integrated DRAM device. Unit cell structures including a memory cell capacitor and a memory cell access transistor have changed significantly as higher levels of integration have been obtained.

For example, a memory cell capacitor for a 1M DRAM device may have a dielectric layer having a planar silicon oxide layer structure. A memory cell capacitor for a 4M DRAM may have a dielectric layer having a stacked O-N-O layered structure wherein silicon oxide and silicon nitride layers are stacked. A memory cell capacitor for a 16M DRAM device may have a dielectric layer having a stacked N-O layered structure wherein a silicon nitride layer and a silicon oxide layer are stacked. The memory cell capacitor for a 64M DRAM may have a dielectric layer having a cylindrical N-O layered structure or a stacked N-O layered structure on an electrode having hemispherical grains (HSG). Memory cell capacitors for 245M and 1 G DRAM devices may include three-dimensional electrode structures such as stacked, cylindrical, or capacitor-on-bit-line structures together with hemispherical grain (HSG) electrode surfaces and ferroelectric dielectric layers.

As will be understood by one having skill in the art, a capacitor includes two electrodes and a dielectric layer therebetween. The capacitance is directly proportional to the permittivity of the dielectric layer and the surface area of the electrodes. The capacitance is inversely proportional to the thickness of the dielectric layer.

Conventional dielectric layers have been provided using silicon oxide layers, silicon nitride layers, and combinations thereof. More recently, ferroelectric materials such as $Ta_2O_5$ have been used to provide dielectric layers. These ferroelectric materials may have a permittivity three to four times higher than that of silicon nitride allowing an increase in capacitance.

Ferroelectric materials, however, have been difficult to use in certain DRAM applications, and it may difficult to reduce the thickness of a dielectric layer beyond a certain point. Accordingly, past attempts to increase memory cell capacitance have been primarily directed to increasing the surface area of the capacitor electrodes. In particular, conventional planar electrode structures have been replaced by three-dimensional structures or by providing structural distortions thereon. For example, stacked electrode structures, trench electrode structures, cylindrical electrode structures, and capacitor-on-bit-line electrode structures have been used to increase capacitor electrode surface areas.

The development of these three-dimensional electrode structures, however, may require more complicated processing steps. accordingly, these three-dimensional structures may result in increased expense due to the increased complexity of the processing steps and design rule limitations. Furthermore, sufficiently large and predictable capacitances may be difficult to obtain using these three-dimensional structures in a highly integrated memory device.

Capacitor electrode surface areas have also been increased by providing hemispherical grains on the surfaces of the electrodes. The use of hemispherical grains (HSG) on a capacitor electrode has been discussed by Watanabe in the reference entitled "Hemispherical Grained Silicon Formation On In-Situ Porous Doped Amorphous-Si Using The Seeding Method". SSDM, 1992, pp. 422–424. As discussed, silicon forms hemispherical-shaped regions due to silicon migration in the transition temperature range of crystalline silicon and amorphous silicon, as the surface energy is most stable in this range. The formation of the hemispherical grains produces a rough surface having a plurality of protrusions which are formed from a surface active silicic gas such as $Si_2H_6$, $SiH_4$ or silicon inside the layers. The surface active silicic gas uses some structurally abnormal or deposited particles of the wafer surface as seeds to enlarge the capacitor surface thereby increasing the capacitance of the capacitor including the electrodes having rough surfaces. Difficulties, however, may result from the use of electrodes having hemispherical grains thereon.

For example, when the lower electrode of the capacitor is doped, the size of the hemispherical grains may increase resulting in the reduction of capacitance due to insufficient impurity diffusion outside the lower electrode. When the lower electrode is doped by a $POCl_3$ deposition, however, a wet etch may be needed to remove a $P_2O_5$ layer formed thereon. This wet etch may abrade some of the protrusions hereby reducing the effect of the capacitor electrode enlargement. The protrusions can also be abraded by the impact of implanted ions.

In addition, the hemispherical grains may be formed between the lower electrodes wherein the hemispherical grains are formed on the lower electrode surfaces thereby shorting lower electrodes. A dry etch may thus be needed to remove hemispherical grained silicon portions on the insulating layer between the lower electrodes. This dry etch, however, may also etch the hemispherical grains formed on the electrode surface thereby reducing the enlargement of the electrode surface area.

Furthermore, the hemispherical grains may also form on the backside of the semiconductor substrate when using a low pressure chemical vapor deposition (LPCVD) to form the hemispherical grains. Accordingly, there is an increased probability that the hemispherical grains may generate particles during subsequent processing steps. Additional processing steps such as backside coating, wet etching, and backside coating removal have been used to reduce the formation of hemispherical grains on the backside of the substrate. The formation of hemispherical grains may also involve steps having relatively narrow processing margins. In particular, hemispherical grains may be formed at the transition temperature of amorphous silicon to polysilicon. The formation of the hemispherical grains is thus sensitive to the temperature controls so that it may be difficult to maintain a uniform size and density of hemispherical grains from wafer to wafer and run to run. Accordingly, there continues to exist a need in the art for improved methods of increasing memory cell capacitances.

SUMMARY OF THE INVENTION

It is therefore an object of the present invention to provide improved methods of forming capacitors for integrated circuit devices.

It is another object of the present invention to provide methods of forming capacitors having increased capacitance.

These and other objects are provided according to the present invention by methods including the steps of forming an insulating layer on an integrated circuit substrate, and forming a conductive layer on the insulating layer opposite the integrated circuit substrate. A patterned ozone tetraethylorthosilicate undoped silicate layer is formed on the conductive layer, and conductive spacers are formed along sidewalls of the ozone tetraethylorthosilicate undoped silicate layer. A dielectric layer is formed on the conductive spacers and on the first conductive layer, and a second conductive layer is formed on the dielectric layer opposite the first conductive layer and the conductive spacers.

The step of forming the conductive spacers can include forming a third conductive layer on the patterned ozone tetraethylorthosilicate undoped silicate layer and etching back the third conductive layer. Conductive bridges can thus be formed between the conductive spacers and these conductive bridges can be exposed by removing the ozone tetraethylorthosilicate undoped silicate layer. The surface area of the lower capacitor electrode can thus be increased.

In addition, the step of forming the conductive spacers can be preceded by the step of treating the sidewalls of the patterned ozone tetraethylorthosilicate undoped silicate layer by wet etching the sidewalls. The wet etch may thus form protrusions extending into the sidewalls of the ozone tetraethylorthosilicate undoped silicate layer, and the conductive spacers may thus fill these vacancies thereby forming conductive protrusions extending from these spacers. These conductive protrusions thus increase the surface area of the lower capacitor electrode thereby increasing the capacitance of the capacitor. In addition, the treating step can be preceded by the step of forming a dense oxide layer on a surface of the patterned ozone tetraethylorthosilicate undoped silicate layer opposite the integrated circuit substrate. Accordingly, the surface of the ozone tetraethylorthosilicate undoped silicate layer is not subjected to the wet etch.

The step of forming the dielectric layer can be preceded by the step of removing the patterned ozone tetraethylorthosilicate undoped silicate layer. In addition, the insulating layer can have a contact hole therethrough exposing a portion of the integrated circuit substrate so that the first conductive layer is electrically coupled with the integrated circuit substrate through the contact hole, and wherein the patterned ozone tetraethylorthosilicate undoped silicate layer is on the first conductive layer opposite the contact hole. The method can also include the step of patterning the first conductive layer using the patterned ozone tetraethylorthosilicate undoped silicate layer as a patterning mask. The step of patterning the first conductive layer can also include using the conductive spacers as a portion of the patterning mask.

A first conductive layer can include polysilicon or amorphous silicon, and the dielectric layer can include a ferroelectric material. More particularly, the ferroelectric material can be tantalum oxide.

According to the methods discussed above, conductive bridges and/or protrusions from the conductive spacers can be used to increase the surface area of a lower capacitor electrode having a cylindrical structure. Accordingly, the capacitance of the resulting capacitor can be increased.

DETAILED DESCRIPTION

Figure 1:
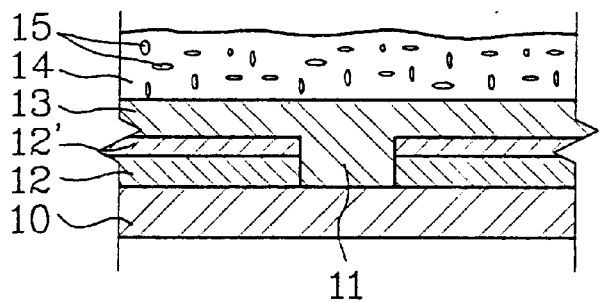
FIGS. 1 through 6 are cross-sectional views illustrating steps of a method according to a first embodiment of the present invention.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout. It will also be understood that when a layer is referred to as being "on" another layer or substrate, it can be directly on the other layer or substrate, or intervening layers may also be present.

Figure 2:
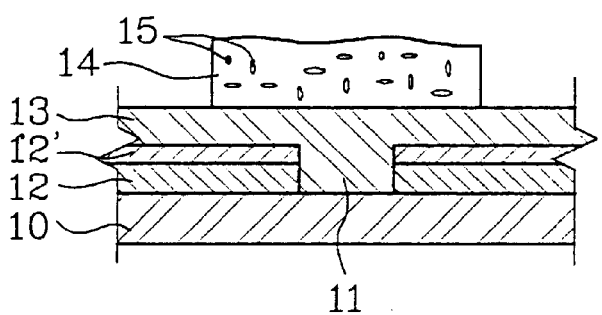

FIGS. 1 through 6 are cross-sectional views illustrating steps of a method according to the first embodiment of the present invention. In particular, an intermediate insulating layer including sub-layers 12 and 12' is formed on a semiconductor substrate 10 and the insulating layer includes a contact hole 11 therein as shown in FIG. 1. Furthermore, a first conductive layer 13 is formed on the insulating layer, and an $O_3$ TEOS USG layer 14 is formed on the first conductive layer 13. The $O_3$ TEOS USG layer 14 is then selectively etched to provide the patterned layer 14 on the first conductive layer 13 opposite the contact hole 11 as shown in FIG. 2.

Figure 3:
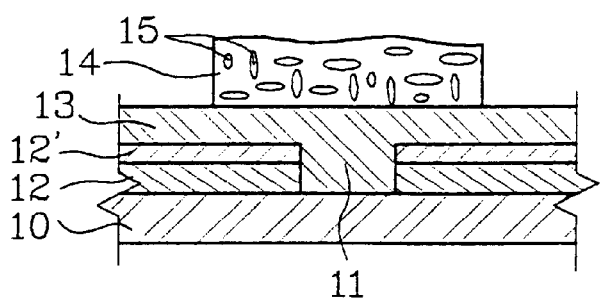
Figure 4:
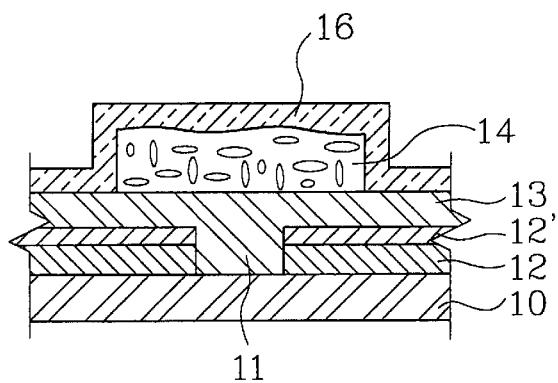
Figure 5:
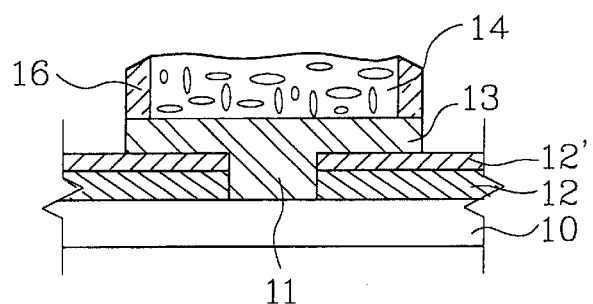
Figure 6:
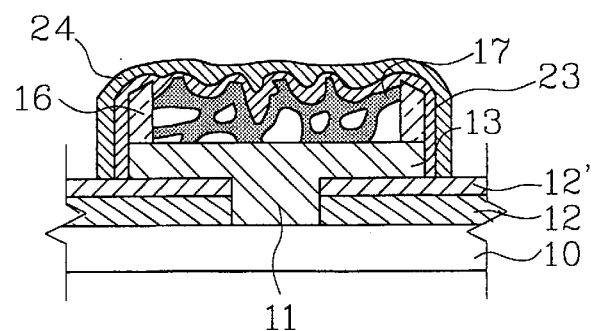

A wet etch is performed on the patterned layer 14 thereby forming an air bridge inside the patterned layer 14 as shown in FIG. 3. A second conductive layer 16 is then deposited on the patterned layer 14 and on the first conductive layer 13 as shown in FIG. 4. An etch back is performed on the second conductive layer thereby forming the conductive spacer 16 and exposing the patterned layer 14 as shown in FIG. 5. The conductive layer 13 can then be patterned using the patterned layer 14 and the conductive spacers 16 as an etching mask. The exposed patterned layer 14 can then be removed using a wet etch as shown in FIG. 6.

The steps illustrated in FIGS. 1 through 6 will now be discussed in greater detail. As shown in FIG. 1, an insulating layer including sub-layers 12 and 12' is formed on the semiconductor substrate 10. Moreover, a contact hole 11 is formed in the insulating layer exposing a portion of the semiconductor substrate 10. A first conducting layer 13 is formed on the insulating layer so that the first conductive layer 13 is electrically coupled to the substrate 10 through the contact hole 11. An $O_3$ TEOS USG layer 14 is formed on the first conductive layer 13. The first conductive layer 13 can be a doped silicon layer, an amorphous silicon layer, a silicide layer, or a metallic layer. In addition, the conductive layer can have a thickness in the range of 500 Å to 5,000 Å, and the $O_3$ TEOS USG layer can have a thickness in the range of 500 Å to 10,000 Å.

As shown, the $O_3$ TEOS USG layer 14 may have a plurality of voids therein, and the surface thereof may be rough, and these characteristics of the layer 14 are used advantageously according to the present invention. In other words, the layer 14 is deposited with the rough surface and voids due to the use of TEOS as a source gas in an environment having a density of ozone greater than one percent. The characteristics of the $O_3$ TEOS USG layer 14 and its dependence on the sub-layers will be explained in greater detail below.

Oxide layers are commonly formed in various semiconductor manufacturing processes, and oxide layers can be formed using diffusion and/or deposition steps. When forming oxide layers by deposition, $S_iH_4$ is a commonly used source gas. In highly integrated circuits, however, the use of organic silicon TEOS as a source gas is increasing. In particular, TEOS can be used as a source gas for hot-wall type low pressure chemical vapor deposition (LPCVD) steps wherein a furnace or side-wall of a processing chamber is heated to a temperature of approximately 700° C. At relatively low temperatures, TEOS can be used as a source gas for atmospheric pressure chemical vapor deposition (APCVD) or semi APCVD steps allowing it to react with ozone at a temperature of approximately 400° C.

When forming an oxide layer by APCVD, a silicon oxide layer is formed by the reaction of TEOS and ozone at normal atmospheric pressure, and the reaction temperature can be reduced by approximately 400° C. from 700° C. when compared with conventional uses of oxygen. The formation of the $O_3$ TEOS USG layer has several characteristics. In particular, the pattern formation and deposition rate of a $O_3$ TEOS USG layer depends on its sub-layer. The sub-layer is not necessarily planar and does not necessarily have uniform material characteristics. The $O_3$ TEOS USG layer may be significantly affected by the material and the formation characteristics of the sub-layer. The film formed over a particular sub-layer may also have an impact on the pattern dependence and the deposition rate of the deposited film.

When a $O_3$ TEOS USG layer is deposited in an environment having a relatively high density of ozone, the deposited $O_3$ TEOS USG layer may have a conspicuous dependence on the sub-layer. While the $O_3$ TEOS USG layer is used because of its advantageous low processing temperature characteristics, the dependence on its sub-layer may be a disadvantage. There have thus been efforts to reduce the dependence of the $O_3$ TEOS USG layer on its sub-layer. For example, there have been efforts to reduce the ozone density to less than one percent, to provide plasma treatments on the sub-layer, and to form intermediary layers having less dependence.

When forming an $O_3$ TEOS USG layer according to the present invention without plasma treatments on the sub-layer and using a relatively high density of ozone, the deposition rate may be relatively low, but a relatively dense layer can be formed on the thermal oxide layer. An $O_3$ TEOS USG layer formed over a polysilicon layer or an amorphous silicon layer or a layer formed by plasma enhanced chemical vapor deposition may have a higher deposition rate, but the surface may be relatively rough and the layer may have voids therein.

As shown in FIG. 2, the $O_3$ TEOS USG layer 14 is selectively etched using photolithography and etch steps leaving a patterned layer 14 on the conductive layer 13 opposite the contact hole 11. The etch is preferably an anisotropic etch. In addition, the conductive layer 13 can be patterned simultaneously with the layer 14 or using the layer 14 as an etching mask thereby providing an electrode pattern. As shown in FIG. 3, a wet etch is performed on the patterned $O_3$ TEOS USG layer 14 without an etch mask. Accordingly, the rough surface and the breaks 15 in the patterned layer 14 are expanded thereby connecting sponge-like voids therein to form air bridges.

The $O_3$ TEOS USG layer 14 is deposited at a relatively high rate due to its sub-layer dependence and its deposited rough surface. The breaks 15 and the voids therein expand as a result of the wet etch thereby enlarging the contacting surface of the oxide layer and air. The size of the air bridge and the aspect of the air bridge can be controlled by controlling the etch conditions.

As shown in FIG. 4, a second conductive layer 16 is deposited on the $O_3$ TEOS USG layer 14 having the plurality of air bridges which function as a path between the inside layers and the wafer surface. If the second conductive layer 16 is also deposited on the air bridges together with the upper surface of the wafer, the air bridges can have conductive properties. The properties of the bridges are thus controlled by controlling the deposition conditions such as the density and temperature of each gas and the time in the enhanced plasma.

The second conductive layer 16 is then etched back as shown in FIG. 5 thereby exposing the $O_3$ TEOS USG layer 14 and forming conductive spacers along sidewalls of the layer 14. The exposed $O_3$ TEOS USG layer 14 is then removed using a wet etch as shown in FIG. 6. The formation of the layer electrode is thus completed, and the lower electrode has a cylindrical structure. Conductive bridges are thus formed inside the cylindrical structure, and these bridges are interconnected with one another in a complex fashion. These bridges can be used to increase the capacitance by enlarging the capacitor electrode surface area.

Without the removal of the $O_3$ TEOS USG layer 14 as shown in FIG. 6, a capacitor can be formed in such a manner that a dielectric material is formed over the surface of the wafer shown in FIG. 5, and a conductive layer is formed over the dielectric material. Referring to FIG. 6, a dielectric layer 23 can be formed on the conductive spacers 16 and on the first conductive layer 13. A second conductive layer 24 can then be formed on the dielectric layer 23 opposite the first conductive layer 13 and the conductive spacers 16. Moreover, the dielectric layer can comprise a ferroelectric material such as tantalum oxide.

As shown in the method illustrated in FIGS. 1 through 6, even though the conductors having the sponge structure 17 can increase the capacitance, it may be difficult to control the processing conditions so that the entire structure falls down thereby forming only protrusions on the wall of the cylindrical structure. Furthermore, if the conductive material falls, the material may generate particles causing processing defects.

Figure 7:
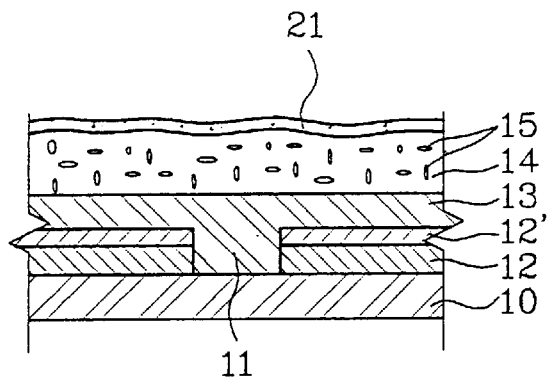
FIGS. 7 through 12 are cross-sectional views illustrating steps of a method according to a second embodiment of the present invention.
Figure 8:
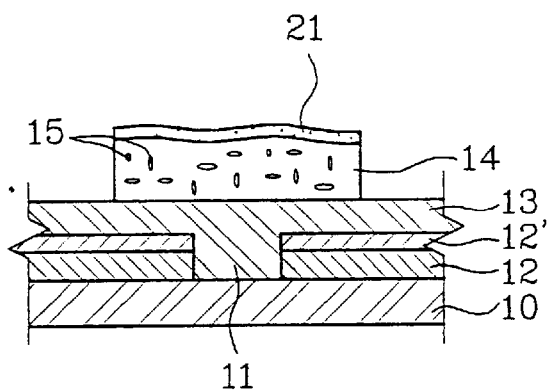

A second method according to the present invention is thus illustrated in FIGS. 7 through 12 thereby reducing the generation of particles. As shown in FIG. 7, a first conductive layer 13 is formed on an insulating layer including sub-layers 12 and 12', and a $O_3$ TEOS USG layer 14 is formed on the conductive layer. In addition, a dense oxide layer 21 is formed on the $O_3$ TEOS USG layer 14. As shown in FIG. 8, the $O_3$ TEOS USG layer 14 and the dense oxide layer 21 are selectively etched using photolithography and etch steps. Accordingly, patterned $O_3$ TEOS USG and dense oxide layers 14 and 21 remain on the conductive layer 13 opposite the contact hole 11.

Figure 9:
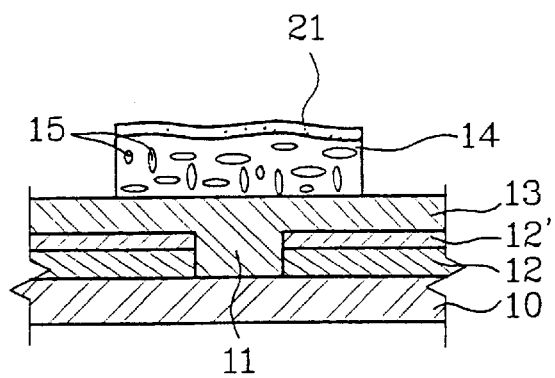

As shown in FIG. 9, a wet etch is used on the exposed sidewalls of the patterned $O_3$ TEOS USG layer 14 using the upper oxide layer 21 as a mask thereby increasing the sizes of voids and roughness in the sidewalls of the $O_3$ TEOS USG layer 14. The upper surface of the $O_3$ TEOS USG layer 14 is protected during the wet etch by the dense oxide layer 21. Accordingly, vacancies along the sidewalls of the $O_3$ TEOS USG layer 14 are extended inward.

Figure 10:
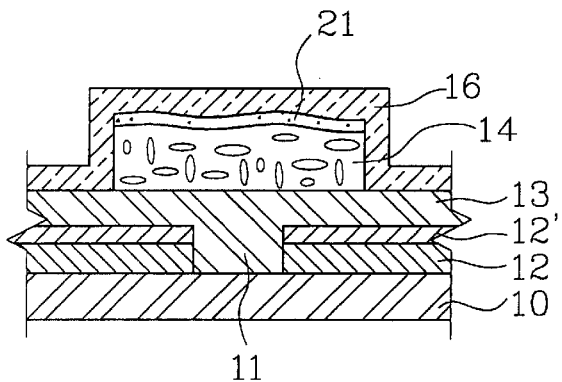
Figure 11:
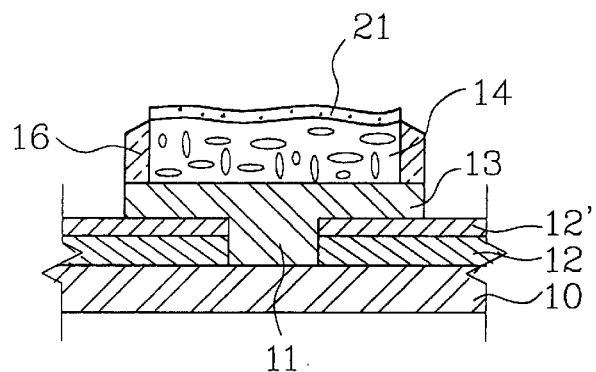
Figure 12:
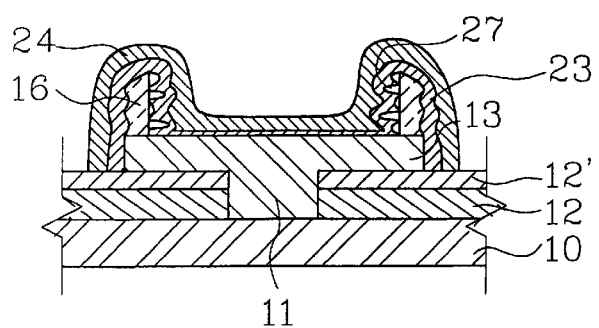

A second conductive layer 16 is formed on the dense oxide layer 21, on the exposed portions of the first conductive layer 13, and along sidewalls of the $O_3$ TEOS USG layer 14 as shown in FIG. 10. An etch back is performed on the second conductive layer 16 so that conductive spacers 16 are provided on sidewalls of the $O_3$ TEOS USG layer 14 as shown in FIG. 11. The dense oxide layer 21 is thus exposed. The dense oxide layer and the loose $O_3$ TEOS USG layer are then removed using a wet etch as shown in FIG. 12. Protrusions 27 of the conductive spacers 16 thus remain.

The method illustrated in FIG. 7 through 12 will now be discussed in greater detail. As shown in FIG. 7, an insulating layer includes sub-layers 12 and 12' having a contact hole 11 therethrough. A first conductive layer 13 is formed on the insulating layer, and this conductive layer is electrically coupled to the semiconductor substrate 10 through the contact hole 11. An $O_3$ TEOS USG layer 14 is formed on the first conductive layer 13, and a dense oxide layer 21 is formed on the layer 14. The dense oxide layer 21 is preferably formed using plasma-enhanced chemical vapor deposition (PECVD).

The $O_3$ TEOS USG layer 14 and the dense oxide layer 21 are then selectively etched using photolithography and etch steps to provide the patterned layers 14 and 21 as shown in FIG. 8. In particular, the patterned layers 14 and 21 are provided on the conductive layer 13 opposite the contact hole 11. In other words, the patterned layers are formed on portions of the conductive layer 13 which will be used to provide a lower capacitor electrode. The etch used to form the patterned layers 14 and 21 is preferably an anisotropic etch. In addition, the conductive layer 13 can be patterned simultaneously with the layers 14 and 21, or the first conductive layer 13 can be patterned using the patterned layers 14 and 21 as an etching mask.

Exposed sidewalls of the $O_3$ TEOS USG layer 14 are then wet etched using the dense oxide layer 21 as an etch mask. Accordingly, breaks 15 and voids in the relatively rough sidewalls of the layer 14 expand forming vacancies extending inward from the sidewalls. Because the upper surface of the $O_3$ TEOS USG layer 14 is protected by the dense oxide layer 21 which is resistant to the wet etch, only sidewalls of the $O_3$ TEOS USG layer 14 are etched. Accordingly, air bridges connecting the upper and side surfaces of the $O_3$ TEOS USG layer 14 are not formed.

A second conductive layer 16 is formed on the dense oxide layer 21, the exposed portions of the first conductive layer 13, and along sidewalls of the layer 14 as shown in FIG. 10. Moreover, portions of the second conductive layer 16 along sidewalls of the layer 14 fill the vacancies which extend into the sidewalls of the layer 14 thereby forming protrusions into the sidewalls of the layer 14. In other words, horizontal conducting protrusions extend from portions of the second conductive layer 16 adjacent sidewalls of the layer 14. An etch back is used on the second conductive layer 16 to form the conductive spacers 16 and to expose the dense oxide layer 21 as shown in FIG. 11. The dense oxide layer 21 and the $O_3$ TEOS USG layer 14 are then removed using a wet etch as shown in FIG. 12. Accordingly, the lower electrode is completed. The lower electrode thus has a cylindrical structure, and the inside walls of the cylindrical structure have horizontal conducting protrusions 27 extending therefrom thereby increasing the surface area of the lower capacitor electrode. Accordingly, the capacitance of a resultant capacitor can be increased. Referring to FIG. 12, A dielectric layer 23 can be formed on the conductive spacers 16 and on the first conductive layer 13. A second conductive layer 24 can then be formed on the dielectric layer 23 opposite the first conductive layer 13 and the conductive spacers 16. Moreover, the dielectric layer can comprise a ferroelectric material such as tantalum oxide.

According to the methods of the present invention, an integrated circuit capacitor can be provided having an increased capacitance. More particularly, the capacitance can be increased by increasing the surface area of the lower capacitor electrode. More particularly, protrusions can be provided on the lower capacitor electrode without adding significant complexity to the manufacturing process.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method of forming an integrated circuit capacitor on an integrated circuit substrate, said method comprising the steps of:

forming an insulating layer on the integrated circuit substrate;

forming a conductive layer on said insulating layer opposite the integrated circuit substrate;

forming a patterned Ozone Tetraethylorthosilicate Undoped Silicate (OTUS) layer on said conductive layer;

forming conductive spacers along sidewalls of said OTUS layer;

forming a dielectric layer on said conductive spacers and on said first conductive layer; and forming a second conductive layer on said dielectric layer opposite said first conductive layer and said conductive spacers;

wherein said step of forming said conductive spacers is preceded by the step of treating said sidewalls of said patterned OTUS layer by wet etching said sidewalls.

2. A method according to claim 1 wherein said step of forming said conductive spacers comprises forming a third conductive layer on said patterned OTUS layer and etching back said third conductive layer.

3. A method according to claim 1 wherein said step of forming said conductive spacers is preceded by the step of treating said sidewalls of said patterned OTUS layer by wet etching said sidewalls.

4. A method according to claim 1 wherein said treating step is preceded by the step of forming an etching mask layer on a surface of said patterned OTUS layer opposite said integrated circuit substrate.

5. A method according to claim 4 wherein said etching mask layer comprises a dense oxide layer.

6. A method according to claim 1 wherein said step of forming said dielectric layer is preceded by the step of removing said patterned OTUS layer.

7. A method according to claim 1 wherein said insulating layer has a contact hole therein exposing a portion of the integrated circuit substrate so that said first conductive layer is electrically coupled with the integrated circuit substrate through said contact hole, and wherein said patterned OTUS layer is on said first conductive layer opposite said contact hole.

8. A method according to claim 1 further comprising the step of patterning said first conductive layer using said patterned OTUS as a patterning mask.

9. A method of forming an integrated circuit capacitor on an integrated circuit substrate, said method comprising the steps of:

forming an insulating layer on the integrated circuit substrate;

forming a conductive layer on said insulating layer opposite the integrated circuit substrate;

forming a patterned Ozone Tetraethylorthosilicate Undoped Silicate (OTUS) layer on said conductive layer;

forming conductive spacers along sidewalls of said OTUS layer;

patterning said first conductive layer using said patterned OTUS layer as a patterning mask wherein said step of patterning said first conductive layer further comprises using said conductive spacers as a portion of said patterning mask;

forming a dielectric layer on said conductive spacers and on said first conductive layer; and forming a second conductive layer on said dielectric layer opposite said first conductive layer and said conductive spacers.

10. A method according to claim 1 wherein said first conductive layer comprises polysilicon or amorphous silicon.

11. A method according to claim 1 wherein said dielectric layer comprise a ferroelectric material.

12. A method according to claim 11 wherein said ferroelectric material comprises tantalum oxide.

13. A method of forming an integrated circuit capacitor, said method comprising the steps of:

forming an insulating layer on a semiconductor substrate wherein said insulating layer has a contact hole therein exposing a portion of said semiconductor substrate;

forming a first conductive layer on said insulating layer wherein said first conductive layer is electrically coupled to said semiconductor substrate through said contact hole;

forming an Ozone Tetraethylorthosilicate Undoped Silicate layer on said first conductive layer;

patterning said Ozone Tetraethylorthosilicate Undoped Silicate layer so that an Ozone Tetraethylorthosilicate Undoped Silicate layer pattern remains on said first conductive layer opposite said contact hole;

wet etching said Ozone Tetraethylorthosilicate Undoped Silicate layer pattern;

forming a second conductive layer on said Ozone Tetraethylorthosilicate Undoped Silicate layer pattern including sidewalls thereof;

etching back said second conductive layer so that portions of said second conductive layer remain on said sidewalls and so that portions of said second conductive layer on a surface of said Ozone Tetraethylorthosilicate Undoped Silicate layer pattern opposite said substrate are removed; and removing said Ozone Tetraethylorthosilicate Undoped Silicate layer pattern.

14. A method according to claim 13 further comprising the step of:

etching portions of said first conductive layer exposed by said Ozone Tetraethylorthosilicate Undoped Silicate layer pattern.

15. A method according to claim 14 wherein said wet etching step and said step of etching portions of said first conductive layer are performed simultaneously using a common etching solution.

16. A method according to claim 14 wherein said step of etching portions of said first conductive layer follows said wet etching step.

17. A method according to claim 13 wherein said wet etching step is preceded by the step of:

forming an etching mask layer on said surface of said Ozone Tetraethylorthosilicate Undoped Silicate layer pattern opposite said substrate.

18. A method according to claim 17 wherein said step of forming said etching mask layer comprises using a Plasma Enhanced Chemical Vapor Deposition (PECVD).

19. A method according to claim 17 wherein said step of removing said Ozone Tetraethylorthosilicate Undoped Silicate layer pattern includes removing said etching mask layer.

20. A method according to claim 17 wherein said etching mask layer comprises a dense oxide layer.

21. A method according to claim 13 wherein said first conductive layer comprises doped polysilicon or amorphous silicon.

22. A method according to claim 13 wherein said patterning step comprises anisotropically etching said Ozone Tetraethylorthosilicate Undoped Silicate layer.

23. A method according to claim 13 further comprising the steps of:

forming a dielectric layer on said first conductive layer and on said remaining portions of said second conductive layer; and forming a third conductive layer on said dielectric layer opposite said first and second conductive layers.

24. A method according to claim 23 wherein said dielectric layer comprises ferroelectric material.

25. A method according to claim 24 wherein said ferroelectric material comprises tantalum oxide.

* * * * *